(12) United States Patent
Miyata et al.

(10) Patent No.: US 9,497,857 B2
(45) Date of Patent: *Nov. 15, 2016

(54) INSULATING SHEET, CIRCUIT BOARD, AND PROCESS FOR PRODUCTION OF INSULATING SHEET

(75) Inventors: Kenji Miyata, Shibukawa (JP); Toshitaka Yamagata, Shibukawa (JP)

(73) Assignee: Denka Company Limited, Tokyo (JP)

( * ) Notice: Subject to any disclaimer, the term of this patent is extended or adjusted under 35 U.S.C. 154(b) by 275 days.

This patent is subject to a terminal disclaimer.

(21) Appl. No.: 13/498,784

(22) PCT Filed: Sep. 13, 2010

(86) PCT No.: PCT/JP2010/065703
§ 371 (c)(1),
(2), (4) Date: Mar. 28, 2012

(87) PCT Pub. No.: WO2011/048885
PCT Pub. Date: Apr. 28, 2011

(65) Prior Publication Data
US 2012/0188730 A1    Jul. 26, 2012

(30) Foreign Application Priority Data
Oct. 22, 2009  (JP) .................................. 2009-243151

(51) Int. Cl.
*B32B 15/08*   (2006.01)
*H05K 1/03*    (2006.01)
(Continued)

(52) U.S. Cl.
CPC ......... *H05K 1/0373* (2013.01); *C08G 59/4223* (2013.01); *C08G 59/621* (2013.01);
(Continued)

(58) Field of Classification Search
USPC ............... 428/323, 325, 327, 330, 366, 209; 257/705, 717, 720
See application file for complete search history.

(56) References Cited

U.S. PATENT DOCUMENTS 5,068,293 A * 11/1991 Kaji ..................... C08G 59/063
                                                        525/534
5,162,400 A * 11/1992 Shiobara ............ C08G 59/3218
                                                      257/E23.119
(Continued)

FOREIGN PATENT DOCUMENTS

JP    04-137316    5/1992
JP    06-091812    4/1994
(Continued)

OTHER PUBLICATIONS

Supplementary European Patent Office Search Report for Application No. EP 10 82 4736 Dated Apr. 18, 2013.
(Continued)

*Primary Examiner* — Humera Sheikh
*Assistant Examiner* — Seth Dumbris
(74) *Attorney, Agent, or Firm* — Roberts Mlotkowski Safran Cole & Calderon, PC

(57) ABSTRACT

An object of the present invention is to provide an insulating sheet superior in heat dissipation efficiency, heat resistance, insulation efficiency and moldability. Provided is a sheet-shaped insulating sheet of a resin composition containing an epoxy resin, a curing agent and an inorganic filler, wherein one or both of the epoxy resin and the curing agent have a naphthalene structure, the inorganic filler contains hexagonal boron nitride, and the inorganic filler is contained in an amount of 70 to 85 vol % in the entire resin composition. It is possible to increase the filling efficiency of an inorganic filler in the insulating sheet by using an epoxy resin and/or
(Continued)

a curing agent having a naphthalene structure, which are favorably compatible with the hexagonal boron nitride contained in the inorganic filler.

18 Claims, 1 Drawing Sheet

(51) Int. Cl.
    *C08G 59/42*         (2006.01)
    *C08G 59/62*         (2006.01)
    *C08L 63/00*         (2006.01)

(52) U.S. Cl.
    CPC ............ C08L 63/00 (2013.01); *H05K 1/0326* (2013.01); *H05K 2201/0209* (2013.01); *Y10T 156/1043* (2015.01); *Y10T 156/1052* (2015.01)

(56) References Cited

U.S. PATENT DOCUMENTS

| | | | | |
|---|---|---|---|---|
| 5,591,811 | A * | 1/1997 | Blyakhman | C07D 231/12 525/504 |
| 5,610,209 | A * | 3/1997 | Kiyono | C08G 59/226 428/413 |
| 5,827,908 | A * | 10/1998 | Arai | C08G 59/245 523/212 |
| 5,844,309 | A * | 12/1998 | Takigawa et al. | 257/701 |
| 6,512,031 | B1 * | 1/2003 | Honda et al. | 524/115 |
| 6,551,711 | B1 * | 4/2003 | Bell et al. | 428/413 |
| 6,645,632 | B2 * | 11/2003 | Honda et al. | 428/413 |
| 6,761,842 | B2 * | 7/2004 | Tobita et al. | 264/435 |
| 6,787,246 | B2 * | 9/2004 | Holl et al. | 428/548 |
| 7,208,062 | B2 * | 4/2007 | Nakamura et al. | 156/153 |
| 7,709,939 | B2 * | 5/2010 | Yonemura et al. | 257/678 |
| 7,722,950 | B2 * | 5/2010 | Guo et al. | 428/356 |
| 7,976,941 | B2 * | 7/2011 | Lodyga et al. | 428/325 |
| 8,110,066 | B2 * | 2/2012 | Kanamaru et al. | 156/325 |
| 8,592,994 | B2 * | 11/2013 | Tachibana et al. | 257/778 |
| 2002/0038725 | A1 * | 4/2002 | Suzuki | H05K 1/0373 174/262 |
| 2002/0078793 | A1 * | 6/2002 | Holl | B22F 1/0059 75/230 |
| 2006/0127422 | A1 * | 6/2006 | Lodyga | C04B 35/58007 424/400 |
| 2007/0164349 | A1 | 7/2007 | Nakasato et al. | |
| 2008/0153960 | A1 | 6/2008 | Meneghetti et al. | |
| 2009/0133912 | A1 * | 5/2009 | Miyata | C08L 63/00 174/260 |

FOREIGN PATENT DOCUMENTS

| | | |
|---|---|---|
| JP | 2000-343577 | 12/2000 |
| JP | 2002-265754 | 9/2002 |
| JP | 2004-335929 | 11/2004 |
| JP | 2008-280436 | 11/2008 |
| JP | 2009-049062 A | 3/2009 |
| JP | 2009-094110 | 4/2009 |
| JP | 2009-130234 A | 6/2009 |
| JP | 2009-144072 A | 7/2009 |
| JP | 2009-227947 A | 10/2009 |
| JP | 2009-231250 | 10/2009 |
| JP | 2011-012193 A | 1/2011 |
| WO | 2008/085999 A1 | 7/2008 |
| WO | 2008-091489 | 7/2008 |
| WO | 2009/041300 A1 | 4/2009 |

OTHER PUBLICATIONS

International Search Report PCT/JP2010/065703 dated Nov. 5, 2010.

* cited by examiner

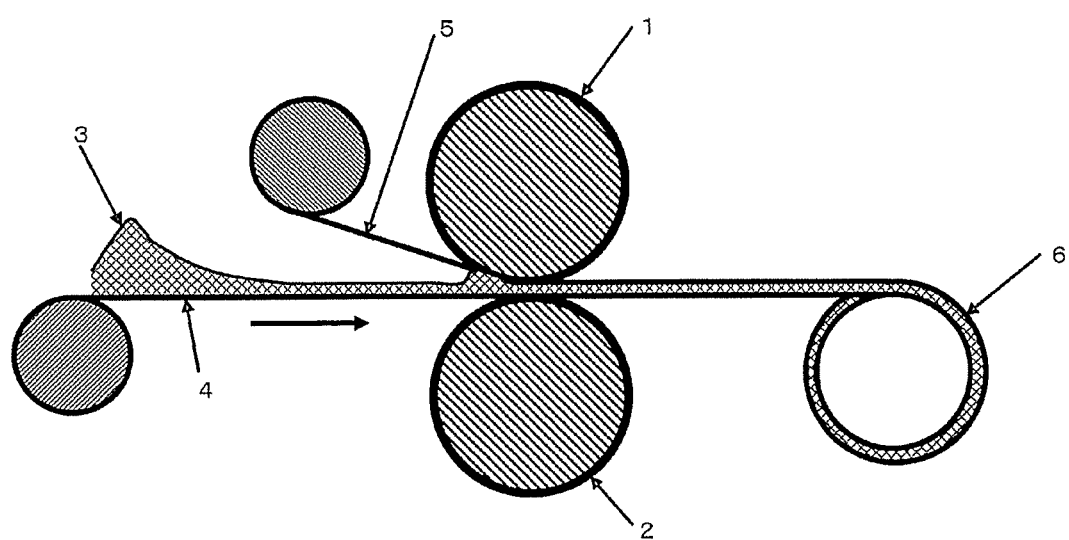

INSULATING SHEET, CIRCUIT BOARD, AND PROCESS FOR PRODUCTION OF INSULATING SHEET

TECHNICAL FIELD

The present invention relates to an insulating sheet superior in thermal conductivity and insulation reliability, a circuit board and a method of producing the insulating sheet.

BACKGROUND ART

Patent Documents 1 and 2 describe methods of producing an insulating resin sheet for substrates containing hexagonal boron nitride as its inorganic filler. Patent Document 3 describes a continuous production method for producing a circuit board, while Patent Document 4 describes a method of producing a circuit board by using a roll press.

CITATION LIST

Patent Literature

[PTL 1] Japanese Unexamined Patent Application Publication No. 2000-343577
[PTL 2] Japanese Unexamined Patent Application Publication No. 2009-94110
[PTL 3] Japanese Unexamined Patent Application Publication No. 2004-335929
[PTL 4] Japanese Unexamined Patent Application Publication No. 2008-280436

SUMMARY OF INVENTION

Technical Problem

For improvement of the heat dissipation efficiency and the heat resistance of an insulating sheet containing hexagonal boron nitride as its inorganic filler, it is desired to raise the filling efficiency of hexagonal boron nitride. However, it has been difficult to raise the filling efficiency of hexagonal boron nitride in traditional insulating sheets containing hexagonal boron nitride as the inorganic filler and thus, such insulating sheets were insufficient in heat dissipation efficiency and heat resistance and also in insulation efficiency and moldability.

Accordingly, a major object of the present invention is to raise the filling efficiency of an inorganic filler containing hexagonal boron nitride and thus to provide an insulating sheet superior in heat dissipation efficiency, heat resistance, insulation efficiency and moldability.

Solution to Problem

To solve the problem above, the present invention provides an insulating sheet prepared in the sheet shape from a resin composition containing an epoxy resin, a curing agent and an inorganic filler, wherein one or both of the epoxy resin and the curing agent have a naphthalene structure, the inorganic filler contains hexagonal boron nitride, and the inorganic filler is contained in an amount of 70 to 85 vol % in the entire resin composition.

It is possible to raise the filling efficiency of an inorganic filler in the insulating sheet by using an epoxy resin and/or a curing agent having a naphthalene structure, which are favorably compatible with the hexagonal boron nitride contained in the inorganic filler.

In the insulating sheet, the inorganic filler preferably contains coarse particles having an average particle diameter of 10 to 400 μm and fine particles having an average particle diameter of 0.5 to 4.0 μm.

The insulating sheet is preferably in the B or C stage state.

Multiple pieces of the insulating sheet may be laminated and cut in the thickness direction, to give a new insulating sheet, as the terminal cut face is made planar. In these insulating sheets, the inorganic filler is preferably oriented in a particular direction.

The present invention also provides a circuit board, comprising a metal substrate, the insulating sheet above laminated on the metal substrate, a metal layer laminated on the insulating sheet, and an electronic circuit formed on the metal layer.

The circuit board may have additionally electronic parts mounted on the electronic circuit.

The present invention also provides a method of producing an insulating sheet, comprising a laminating step of laminating a resin composition containing an epoxy resin, a curing agent and an inorganic filler, wherein one or both of the epoxy resin and the curing agent have a naphthalene structure, the inorganic filler contains hexagonal boron nitride, and the inorganic filler is contained in an amount of 70 to 85 vol % in the entire resin composition, between two supporting films and a molding step of molding the laminate after the laminating step into an insulating sheet having a thickness of 50 to 500 μm.

Preferably in the production method, the molding means in the molding step is a roll press and the temperature of the resin composition during molding is 5 to 300° C.

Also preferably in the production method, the supporting film used is a polymer film release-treated on the surface in contact with the resin composition or a metal foil.

Further, production method may have a laminating step of laminating multiple pieces of the insulating sheet above, a cutting step of cutting the laminate after the laminating step in the thickness direction, and a planarization step of making the terminal cut face planar.

Advantageous Effects of Invention

The present invention raises filling efficiency of an inorganic filler containing hexagonal boron nitride and thus, provides an insulating sheet superior in heat dissipation efficiency, heat resistance, insulation efficiency and moldability.

BRIEF DESCRIPTION OF DRAWINGS

FIG. 1 is a schematic view explaining a production method of an insulating sheet of an Example.

DESCRIPTION OF EMBODIMENTS

Hereinafter, favorable embodiments of the present invention will be described. The embodiments described below are typical embodiments of the present invention and it should be understood that the scope of the present invention is not limited thereby. The description will be given in the following order.
1. Insulating sheet
(1) Epoxy resin
(2) Curing agent
(3) Inorganic filler
(4) Insulating sheet 2. Circuit board
3. Production method of insulating sheet 1. Insulating Sheet An insulating sheet according to the present invention is an insulating sheet prepared in a sheet shape from a resin composition containing an epoxy resin, a curing agent and an inorganic filler, wherein one or both of the epoxy resin and the curing agent have a naphthalene structure, the inorganic filler contains hexagonal boron nitride, and the inorganic filler is contained in an amount of 70 to 85 vol % in the entire resin composition.

(1) Epoxy Resin

The epoxy resin is an epoxy compound having two or more epoxy groups in the molecule, and it is preferably an epoxy resin having a naphthalene structural skeleton that is favorably compatible with the hexagonal boron nitride contained in the inorganic filler for improvement of the filling efficiency of the inorganic filler.

The amount of the epoxy resin blended is preferably 7.5 parts or more by weight and 18.0 parts or less by weight, more preferably 8.8 parts or more by weight and 16.7 parts or less by weight.

(2) Curing Agent

The curing agent is a curing agent based on an epoxy resin and typical examples thereof include phenolic novolak resins, acid anhydride resins, amino resins and imidazoles. In particular, curing agents having a naphthalene structural skeleton are preferable for improvement of the filling efficiency of the inorganic filler. Phenolic novolak resins having a naphthalene structural skeleton include naphthol aralkyl-type phenols, while acid anhydride resins having a naphthalene structural skeleton include naphthalenetetracarboxylic dianhydride. The naphthalene structural skeleton may be present in at least one of the epoxy resin and the curing agent for improvement of the filling efficiency of the inorganic filler.

The amount of the curing agent blended is preferably 0.5 part or more by weight and 8.0 parts or less by weight, more preferably 0.9 part or more by weight and 6.55 parts or less by weight.

(3) Inorganic Filler

The inorganic filler is a material added for improvement of thermal conductivity and typical examples thereof include spherical alumina, aluminum oxide, magnesium oxide, boron nitride, hexagonal boron nitride, aluminum nitride, silicon nitride and silicon carbide. The inorganic filler preferably contains hexagonal boron nitride and spherical alumina. Use of the hexagonal boron nitride leads to decrease of the dielectric constant of the insulating sheet and increase of the insulation efficiency and the thermal conductivity.

The content of the inorganic filler is 70 to 85 vol %, preferably 75 to 83 vol % in the entire volume. Decrease in the content of the thermally conductive filler leads to decrease of the thermal conductivity of the insulating sheet, while increase in the content leads to deterioration in insulation efficiency and mechanical strength, because of pores easily generated during molding.

The inorganic filler preferably contains coarse particles having an average particle diameter of 10 to 400 μm and fine particles having an average particle diameter of 0.5 to 4.0 μm. Use of coarse particles and fine particles in the inorganic filler permits packing of the fine particles between the coarse particles, thus leading to increase of the filling fraction of the entire inorganic filler. When the inorganic filler contains both coarse and fine particles, the blending rate of the coarse particles is preferably 70% or more, more preferably 75% or more. It is because lower coarse particle rate leads to deterioration of the flowability of the resin composition, prohibiting production of densely filled insulating sheets.

The insulating sheet is preferably in the B or C stage state. The B stage state is a state where the resin composition is dry at room temperature and melts again when heated to high temperature, more specifically a state where the curing degree, as determined from the quantity of heat generated during curing by using a DSC (differential scanning calorimetry), is less than 70%. The C stage state is a state where the resin composition is cured almost completely and the resin composition does not melt again even when heated to high temperature, more specifically a state where the curing degree is 70% or more. It is possible to obtain higher thermal conductivity by bringing the insulating sheet into the B or C stage state.

The inorganic filler blended in the resin composition constituting the insulating sheet is preferably oriented in a particular direction. It is possible to control the heat-release direction by orienting the inorganic filler in a particular direction. Specifically in the case of a roll press, the inorganic filler in the insulating sheet is oriented in the molding direction of the roll press, i.e., in the flow direction of the plane of the insulating sheet.

Multiple pieces of the insulating sheet may be laminated and cut in the thickness direction and the laminate may be used as a new substrate material, as the terminal cut face is made planar. Because the inorganic filler is oriented in the thickness direction of the insulating sheet (direction perpendicular to the plane flow direction) in the insulating sheet of this configuration, the insulating sheet is particularly useful when heat is to be released in the thickness direction.

2. Circuit Board

The circuit board according to the present invention is a circuit board having a metal substrate, the insulating sheet described above laminated on the metal substrate, a metal layer laminated on the insulating sheet and an electronic circuit formed on the metal layer. The circuit board may have additionally electronic parts mounted on the electronic circuit.

As described above, the insulating sheet according to the present invention shows superior heat dissipation efficiency, heat resistance and insulation efficiency, as the inorganic filler is filled therein more effectively. Thus, the circuit board is superior in heat dissipation efficiency and heat resistance and has low dielectric constant and favorable insulation efficiency.

3. Production Method of Insulating Sheet

The production method of the insulating sheet according to the present invention includes a laminating step of laminating a resin composition containing an epoxy resin, a curing agent and an inorganic filler, wherein one or both of the epoxy resin and the curing agent have a naphthalene structure, the inorganic filler contains hexagonal boron nitride, and the inorganic filler is contained in an amount of 70 to 85 vol % in the entire resin composition between two supporting films and a molding step of molding the laminate after the laminating step into an insulating sheet having a thickness of 50 to 500 μm.

The molding means in the molding step of the production method is preferably a roll press and the temperature of the resin composition is preferably 5 to 300° C. during molding. When the temperature of the resin composition during molding is too low, the operational environment needed for preservation of low temperature becomes complicated, interfering with processability, while, when the temperature of the resin composition during molding is too high, it becomes difficult to obtain an insulating sheet with uniform thickness, because of thermal expansion of the roll press and the supporting film, unfavorably. It is possible to bring the insulating sheet into the B stage state by keeping the temperature in the range above during molding. It is preferable to treat the insulating sheet at higher temperature to bring it into the C stage state.

In the production method, the supporting film is preferably a polymer film release-treated on the surface in contact with the resin composition or a metal foil. It is possible, by using a polymer film release-treated on the surface in contact with the resin composition or a metal foil, to retain heat resistance more consistently.

The materials for the polymer films used as the supporting film include polypropylene, polycarbonate, polyethylene naphthalate, polyethylene terephthalate, polytetrafluoroethylene, polyphenylene sulfide, polyvinylidene fluoride, polyimide, and the like. The thickness of the polymer film can be, for example, 5 to 300 μm.

The materials for the metal foils used as the supporting film include copper, aluminum, nickel, iron, tin, silver, titanium, gold, magnesium, silicon or the alloys thereof. The material may be plated with nickel or a nickel-gold alloy. The thickness of the metal foil can be, for example, 4 to 300 μm.

The production method can comprise a laminating step of laminating multiple pieces of the insulating sheet, a cutting step of cutting the laminate after the laminating step in the thickness direction, and a planarization step of making the terminal cut face planar. It is possible by these steps to obtain an insulating sheet in which the inorganic filler is oriented in the thickness direction (direction perpendicular to the plane flow direction).

EXAMPLES

Inventive Examples will be described below in detail, as compared with Comparative Examples, with reference to "Table 1", "Table 2" and drawings.

TABLE 1

| Composition & evaluation | | | | Example | | | | | | | | | |
|---|---|---|---|---|---|---|---|---|---|---|---|---|---|
| | | | | 1 | 2 | 3 | 4 | 5 | 6 | 7 | 8 | 9 | 10 |
| Resin composition (part by weight) | Epoxy resin/naphthalene-type | | | 16.7 | 10.5 | 8.8 | 10.5 | 10.5 | 9.8 | 16.7 | 8.8 | 7.7 | 4.5 |
| | Curing agent | Imidazoles (part by weight) | | 1.60 | 1.00 | 0.90 | 1.00 | 1.00 | 1.00 | 1.60 | 0.90 | 0.05 | 0.05 |
| | | Naphthalenetetracarboxylic dianhydride (part by weight) | | — | — | — | — | — | — | — | — | 3.5 | — |
| | | Naphthol aralkyl-type phenol resin (part by weight) | | — | — | — | — | — | — | — | — | — | 6.5 |
| | Inorganic filler | Coarse powder | Material | BN | BN | BN | BN | BN | BN | BN | BN | BN | BN |
| | | | Shape | Flat plate | Flat plate | Flat plate | Flat plate | Flat plate | Flat plate | Aggregation | Aggregation | Flat plate | Flat plate |
| | | | Tap density (g/cm$^3$) | 0.8 | 0.8 | 0.8 | 0.8 | 0.8 | 0.8 | 1.0 | 1.0 | 0.8 | 0.8 |
| | | | GI value | 0.6 | 0.6 | 0.6 | 0.6 | 0.6 | 0.6 | 1.1 | 1.1 | 0.6 | 0.6 |
| | | | Average diameter (μm) | 23 | 23 | 23 | 23 | 23 | 23 | 300 | 300 | 23 | 23 |
| | | | Blending amount (part by weight) | 69.6 | 75.31 | 76.9 | 61.9 | 88.4 | 75.9 | 69.6 | 76.9 | 75.31 | 75.31 |
| | | Fine powder | Material | BN | BN | BN | BN | BN | Al$_2$O$_3$ | BN | BN | BN | BN |
| | | | Shape | Flat plate | Flat plate | Flat plate | Flat plate | Flat plate | Spherical | Flat plate | Flat plate | Flat plate | Flat plate |
| | | | Average diameter (μm) | 2.2 | 2.2 | 2.2 | 2.2 | 2.2 | 0.5 | 2.2 | 2.2 | 2.2 | 2.2 |
| | | | Blending amount (part by weight) | 12.1 | 13.1 | 13.4 | 26.5 | 0 | 13.2 | 12.1 | 13.4 | 13.1 | 13.1 |
| | | Filling rate (vol %) | | 70 | 80 | 83 | 80 | 80 | 80 | 70 | 83 | 80 | 80 |
| | | Coarse particle ratio (%) | | 85 | 85 | 85 | 70 | 100 | 85 | 85 | 85 | 85 | 85 |
| | Organic solvent (part by weight) | | | 0.0 | 0.0 | 0.0 | 0.0 | 0.0 | 0.0 | 0.0 | 0.0 | 0.0 | 0.0 |
| | Coupling agent (part by weight) | | | 0.5 | 0.5 | 0.5 | 0.5 | 0.5 | 0.5 | 0.5 | 0.5 | 0.5 | 0.5 |
| Production method | Molding step | Sheet molding | | Roll press | | | | | | | | | |
| | | Temperature (° C.) | | 120 | | | | | | | | | |
| | | Supporting film | | PET | | | | | | | | | |
| | | Curing degree (%) | | 38 | 42 | 45 | 41 | 40 | 42 | 36 | 40 | 40 | 41 |
| | Post-treatment process | Pretreatment | | Lamination of the sheet obtained in molding step | | | | | | | | | |
| | | Post-curing | | Curing with hot press | | | | | | | | | |
| | | Processing | | Cutting in the thickness direction | | | | | | | | | |
| Evaluation | Heat resistance | Thickness of insulation layer (μm) | | 120 | 150 | 150 | 180 | 140 | 140 | 200 | 230 | 180 | 180 |
| | | Heat resistance (° C.) | | 421 | 435 | 440 | 434 | 435 | 430 | 419 | 438 | 415 | 445 |
| | Thermal conductivity | Thickness direction | Thermal diffusion coefficient (m$^2$/sec) | 13.6 | 21.2 | 25.8 | 18.8 | 22.9 | 16.0 | 9.8 | 14.3 | 16.9 | 16.6 |
| | | | Thermal conductivity (W/mK) | 23.0 | 36.1 | 44.2 | 32.1 | 39.1 | 27.8 | 16.5 | 24.2 | 28.7 | 28.0 |

TABLE 1-continued

| Composition & evaluation | | Example | | | | | | | | | |
|---|---|---|---|---|---|---|---|---|---|---|---|
| | | 1 | 2 | 3 | 4 | 5 | 6 | 7 | 8 | 9 | 10 |
| | In-plane direction | Thermal diffusion coefficient (m/sec) | 1.7 | 1.8 | 1.9 | 2.0 | 2.4 | 3.6 | 8.4 | 13.3 | 2.3 | 2.6 |
| | | Thermal conductivity (W/mK) | 2.8 | 3 | 3.2 | 3.4 | 4.1 | 6.2 | 14.2 | 22.4 | 3.9 | 4.4 |
| Specific density (kg/m³) | | 1.92 | 2.03 | 2.04 | 2.03 | 2.03 | 2.12 | 1.91 | 2.01 | 2.02 | 2.01 |
| Specific heat (J/kgK) | | 0.88 | 0.84 | 0.84 | 0.84 | 0.84 | 0.82 | 0.88 | 0.84 | 0.84 | 0.84 |
| Initial dielectric strength (kV/mm) | | 40 | 38 | 30 | 32 | 36 | 32 | 35 | 30 | 25 | 24 |

1. Insulating Sheet

Example 1

The resin composition having a composition shown in "Table 1" was molded into a sheet shape. The epoxy resin used was a naphthalene-type epoxy resin (HP4032, produced by DIC Corporation) having a naphthalene structure, the curing agent used was imidazoles (2E4 MZ-CN, produced by Shikoku Chemicals Corporation), and the coupling agent used was a silane-coupling agent (Z-0640N, produced by Dow Corning Toray Co., Ltd.). The inorganic filler used was hexagonal boron nitride (indicated by "BN" in the Table).

The average particle diameter of the inorganic filler was determined by using a "laser-diffraction particle size distribution analyzer SALD-200," produced by Shimadzu Corporation. The sample was obtained by placing 50 cc of pure water and 5 g of thermally conductive powder to be analyzed in a glass beaker, agitating the mixture with a spatula and dispersing the powder therein by treating it in an ultrasonicator for 10 minutes. The dispersion of the thermal conductivity material powder after the dispersion treatment was added dropwise into the sampler unit of the analyzer and left still until the absorbance became stabilized to the degree permitting measurement. Measurement was made when the absorbance was stabilized. In the laser-diffraction particle size distribution analyzer, the particle size distribution was calculated from the data of light intensity distribution of the sensor-detected diffracted/scattered light from the particles. The average particle diameter was calculated by multiplying the measured particle diameter by relative particle amount (difference, %) and dividing it by the total amount of the relative particle amounts (100%). The average particle diameter is the average diameter of the particles.

A sheet-shaped molding of the resin composition prepared in the production machine shown in FIG. 1 was used for measurement of the effects (see the column of the molding step in the production method in "Table 1").

In preparation of the sheet-shaped molding, the resin composition 3 was pressed at a linear pressure of 2000 kg/10 cm by using a roll press of feeding the resin composition between a top roll 1 and a bottom roll 2 set to 120° C., as it was held between an bottom-side supporting film 4 and a top-side supporting film 5, into a semi-cured thin-film insulating sheet 6, as shown in FIG. 1. Subsequently as shown in the column of the post-treatment process in the column of production method in "Table 1," 50 pieces of the insulating sheet in the semi-cured state are laminated, integrated by heat treatment using a hot press at 150° C. for 1 hour, and cut in the thickness direction, to give an insulating sheet, as the terminal surface cut face is made planar.

Evaluation methods will be described below with reference to "Table 1."

Thermal conductivity was evaluated by heat resistance and thermal conductivity. Alternatively, insulation reliability was evaluated by the initial dielectric strength.

(Heat Resistance)

20 mg of a resin composition was placed in a platinum container; the heat weight loss thereof was measured, as it was heated from 25° C. to 1000° C. at a heating rate of 10° C./min; and the temperature at a weight-decrease rate of 5 wt % was determined. The analyzer used was TG-DTA (ThermoPlus Evo TG8120, produced by Rigaku Corporation.) A heat resistance of 350° C. or higher is needed.

(Thermal Conductivity)

<Thermal Conductivity in the Thickness Direction>

The thermal conductivity in the thickness direction was calculated by multiplying the thermal diffusion coefficient, specific density and specific heat of the resin composition. A thermal conductivity in the thickness direction of 2.0 W/mK or more is needed. The thermal diffusion coefficient, basic data for the calculation, was determined by laser flash method after the resin composition was processed into a shape of 10 mm×10 mm (width)×1 mm (thickness). The analyzer used was a xenon flash analyzer (LFA447 Nano-Flash, produced by NETZSCH). The specific density was determined by the Archimedes method. The specific heat was determined by using a DSC (ThermoPlus Evo DSC8230, produced by Rigaku Corporation.)

<Thermal Conductivity in the In-Plane Direction>

The thermal conductivity in the in-plane direction was calculated similarly from the product of the thermal diffusion coefficient and the specific density and specific heat capacity of the sample. The thermal conductivity in the in-plane direction should also be 2.0 W/mK or more. The thermal diffusion coefficient, basic date for the calculation, was determined by optical AC method after the resin composition was processed into the shape of 5 mm×30 mm (width)×0.4 mm (thickness). The analyzer used was a laser-heating AC thermal diffusivity analyzer (LaserPit, produced by ULVAC-RIKO, Inc.). The specific density and the specific heat capacity used were those obtained in the measurement for thermal conductivity in the thickness direction.

(Insulation Reliability)

<Initial Dielectric Strength>

An insulating sheet having a thickness of 0.5 mm was laminated on an aluminum plate having a thickness of 1.5 mm and a copper foil having a thickness of 0.1 mm was laminated onto the insulating sheet. After the lamination, the laminate was left still at 150° C. for 2.0 hours for complete curing, to give a circuit board. The periphery of the copper foil of the circuit board was etched, leaving a circular region having a diameter of 20 mm; the circuit board was immersed in an electrical insulating oil; and the initial dielectric strength of the sample was determined at room temperature in accordance with JIS C2110, as AC voltage was applied between the copper foil and the aluminum plate. The analytical instrument used was TOS-8700, produced by Kikusui Electronics Corp. An initial dielectric strength of 20 (kV/mm) or more is needed.

The insulating sheet of Example 1 was favorable in all evaluation tests.

Examples 2 to 10

Examples 2 to 10 were carried out similarly to Example 1, except the changes shown in "Table 1."

The $Al_2O_3$ used in Example 6 was a spherical aluminum oxide (ASFP-20, produced by Denki Kagaku Kogyo Kabushiki Kaisha) containing 90 vol % particles having a particle diameter of 3.0 μm or less and the balance of those having an average particle diameter of 0.5 μm.

The coarse particles BN in the shape of "aggregation" in the column of inorganic filler in Examples 7 and 8 are PT670, a product of Momentive Performance Materials Inc., which has an average particle diameter 300 μm, a tap density of 1.0 g/cm³ and a GI (graphitization index) value of 1.1. The GI value is represented by the ratio of the area of 002 diffraction line [Area (002)] to the area of 100 diffraction line [Area (100)] in X-ray diffraction, as shown below. Lower GI value means more advanced crystallization. Low crystallinity, which leads to insufficient growth of the particles and thus to decrease in thermal conductivity, is unfavorable.

$$GI=Area(100)/Area(002)$$

Naphthalenetetracarboxylic dianhydride as the curing resin in Example 9 is NTCDA produced by JFE Chemical Corporation.

Naphthol aralkyl-type phenol resin as the curing resin in Example 10 is SN-485 produced by Tohto Kasei Co., Ltd.

Examples 11 to 13

Examples 11 to 13 were carried out similarly to Example 1, except the changes in composition and post-treatment process shown in "Table 2." The curing catalyst used in "Table 2" was triphenylphosphine.

TABLE 2

| | | | | Example-Comparative example ||||||| 
| | | | | Example ||||||| 
| Composition & evaluation | | | | 11 | 12 | 13 | 14 | 15 | 16 | 17 |
| --- | --- | --- | --- | --- | --- | --- | --- | --- | --- | --- |
| Resin composition | Epoxy resin | Naphthalene-type (part by weight) | | 16.7 | 10.5 | 8.8 | 8.8 | 10.5 | 10.5 | 10.5 |
| | | Alicyclic bis-A-type (part by weight) | | — | — | — | — | — | — | — |
| | | Biphenyl-type (part by weight) | | — | — | — | — | — | — | — |
| | | Triazine-type (part by weight) | | — | — | — | — | — | — | — |
| | Curing agent | Imidazoles (part by weight) | | 1.60 | 1.00 | 0.90 | 0.90 | 1.00 | 1.00 | 1.00 |
| | Inorganic filler | Coarse powder | Material | BN | BN | BN | BN | BN | BN | BN |
| | | | Shape | Flat plate | Flat plate | Flat plate | Flat plate | Flat plate | Flat plate | Flat plate |
| | | | Tap density (g/cm³) | 0.8 | 0.8 | 0.8 | 0.2 | 0.8 | 0.8 | 0.8 |
| | | | GI value | 0.6 | 0.6 | 0.6 | 1.55 | 0.6 | 0.6 | 0.6 |
| | | | Average diameter (μm) | 23 | 23 | 23 | 5 | 23 | 23 | 23 |
| | | | Blending amount (part by weight) | 69.6 | 75.31 | 76.9 | 76.9 | 53 | 53 | 53 |
| | | Fine powder | Material | BN | BN | BN | BN | BN | BN | BN |
| | | | Shape | Flat plate | Flat plate | Flat plate | Flat plate | Flat plate | Flat plate | Flat plate |
| | | | Average diameter (μm) | 2.2 | 2.2 | 2.2 | 2.2 | 2.2 | 2.2 | 2.2 |
| | | | Blending amount (part by weight) | 12.1 | 13.1 | 13.4 | 13.4 | 35.4 | 35.4 | 35.4 |
| | | Filling rate (vol %) | | 70 | 80 | 83 | 80 | 80 | 80 | 80 |
| | | Coarse particle ratio (%) | | 85 | 85 | 85 | 85 | 60 | 60 | 60 |
| | Curing catalyst (part by weight) | | | 1.8 | 1.9 | 2.0 | 0.9 | 1 | 1 | 1 |
| | Organic solvent (part by weight) | | | 0.0 | 0.0 | 0.0 | 0.0 | 0.0 | 0.0 | 15.0 |
| | Coupling agent (part by weight) | | | 0.5 | 0.5 | 0.5 | 0.5 | 0.5 | 0.5 | 0.5 |
| Production method | Molding step | Sheet molding | | Roll press |||||| Hot press |
| | | Temperature (° C.) | | 120 |||||| 150 |
| | | Supporting film | | PET |||||| Copper |
| | | Curing degree (%) | | 36 | 40 | 44 | 40 | 41 | 42 | 36 |
| | Post-treatment process | Pretreatment | | Roll press |||||| None |
| | | Post-curing | | Curing with hot press |||||| None |
| | | Processing | | None |||||| None |
| Evaluation | Heat resistance | Thickness of insulation layer (μm) | | 100 | 140 | 150 | 150 | 160 | 320 | Unmeasurable |
| | | Heat resistance (° C.) | | 410 | 420 | 440 | 435 | 430 | 418 | 328 |
| | Thermal conductivity | Thickness direction | Thermal diffusion coefficient (m²/sec) | 1.8 | 1.9 | 2.0 | 2.1 | 2.0 | 1.2 | Unfavorable |
| | | | Thermal conductivity (W/mK) | 3.0 | 3.2 | 3.4 | 3.5 | 3.4 | 1.5 | Unfavorable |

TABLE 2-continued

| | | | | | | | | | |
|---|---|---|---|---|---|---|---|---|---|
| In-plane direction | Thermal diffusion coefficient (m²/sec) | | 14.2 | 22.4 | 24.6 | 16.9 | 18.9 | 22.4 | Unfavorable |
| | Thermal conductivity (W/mK) | | 24.0 | 38.2 | 42.1 | 28.2 | 32.2 | 28.4 | Unfavorable |
| Specific density (kg/m³) | | | 1.92 | 2.03 | 2.04 | 1.92 | 1.91 | 1.41 | 1.21 |
| Specific heat (J/kgK) | | | 0.88 | 0.84 | 0.84 | 0.87 | 0.89 | 0.9 | Unfavorable |
| Initial dielectric strength (kV/mm) | | | 71.0 | 62.0 | 54.0 | 38.0 | 35.0 | Unfavorable | Unfavorable |

| | | | Example-Comparative example | | | |
|---|---|---|---|---|---|---|
| | | | Example | | Comparative example | |
| Composition & evaluation | | | 18 | 19 | 1 | 2 |
| Resin composition | Epoxy resin | Naphthalene-type (part by weight) | 10.5 | 10.5 | — | — |
| | | Alicyclic bis-A-type (part by weight) | — | — | 6.25 | 6.25 |
| | | Biphenyl-type (part by weight) | — | — | 6.25 | — |
| | | Triazine-type (part by weight) | — | — | — | 6.25 |
| | Curing agent | Imidazoles (part by weight) | 1.00 | 1.00 | 1.35 | 1.35 |
| | Inorganic filler | Coarse powder | Material | BN | BN | BN | BN |
| | | | Shape | Flat plate | Flat plate | Flat plate | Flat plate |
| | | | Tap density (g/cm³) | 0.8 | 0.8 | 0.8 | 0.8 |
| | | | GI value | 0.6 | 0.6 | 0.6 | 0.6 |
| | | | Average diameter (μm) | 23 | 23 | 23 | 23 |
| | | | Blending amount (part by weight) | 53 | 53 | 53 | 53 |
| | | Fine powder | Material | BN | BN | BN | BN |
| | | | Shape | Flat plate | Flat plate | Flat plate | Flat plate |
| | | | Average diameter (μm) | 2.2 | 2.2 | 2.2 | 2.2 |
| | | | Blending amount (part by weight) | 35.4 | 35.4 | 35.4 | 35.4 |
| | | Filling rate (vol %) | 80 | 80 | 80 | 80 |
| | | Coarse particle ratio (%) | 60 | 60 | 60 | 60 |
| | Curing catalyst (part by weight) | | 1 | 1 | 1 | 1 |
| | Organic solvent (part by weight) | | 0.0 | 15.0 | 0.0 | 0.0 |
| | Coupling agent (part by weight) | | 0.5 | 0.5 | 0.5 | 0.5 |
| Production method | Molding step | Sheet molding | Screen printing | | Roll press | |
| | | Temperature (° C.) | 25 | | 120 | |
| | | Supporting film | None | | PET | |
| | | Curing degree (%) | 5 | 8 | 42 | 36 |
| | Post-treatment process | Pretreatment | None | | None | |
| | | Post-curing | Curing with hot press | | Curing with hot press | |
| | | Processing | None | | None | |
| Evaluation | Heat resistance | Thickness of insulation layer (μm) | Unmeasurable | Unmeasurable | 310 | 340 |
| | | Heat resistance (° C.) | Unfavorable | 435 | 402 | 414 |
| | Thermal conductivity | Thickness direction | Thermal diffusion coefficient (m²/sec) | Unfavorable | Unfavorable | 0.8 | 0.9 |
| | | | Thermal conductivity (W/mK) | Unfavorable | Unfavorable | 1.0 | 1.1 |
| | | In-plane direction | Thermal diffusion coefficient (m²/sec) | Unfavorable | Unfavorable | 11.0 | 10.3 |
| | | | Thermal conductivity (W/mK) | Unfavorable | Unfavorable | 14.2 | 12.1 |
| | Specific density (kg/m³) | | Unfavorable | 1.18 | 1.42 | 1.33 |
| | Specific heat (J/kgK) | | Unfavorable | Unfavorable | 0.91 | 0.88 |
| | Initial dielectric strength (kV/mm) | | Unfavorable | Unfavorable | Unfavorable | Unfavorable |

Analysis of the inorganic particles in the substrate materials of Examples 11 to 13 all showed an orientation degree of 0.01 or less, indicating that the particles are oriented favorably in the in-plane direction. As a result, the thermal conductivity in the in-plane direction became larger, and the temperature of the entire substrate became more uniform than that of the substrate of Example 1. When the uniform-temperature substrate was used, the entire electronic device had uniform temperature, showing stabilized operational performance.

Example 14

Example 14 was carried out similarly to Example 13, except that HP-P4, produced by Mizushima Iron Works, Ltd. was used as the plate-shaped hexagonal boron nitride, coarse particles of inorganic filler. There were favorable effects obtained also in this Example.

Example 15

Example 15 was carried out similarly to Example 13, except that the blending ratio of coarse particles to fine particles in the inorganic filler was, changed as shown in "Table 2." There were favorable effects obtained also in this Example.

Examples 16 and 17

Example 16 was carried out similarly to Example 15, except that the roll press was replaced with a hot press. Example 17 was carried out similarly to Example 16, except that an organic solvent (butyl cellosolve, produced by Wako Pure Chemical Industries, Ltd.) was added.

Examples 18 and 19

Example 18 was carried out similarly to Example 15, except that the roll press was replaced with a screen printing method. Example 19 was carried out similarly to Example 18, except that an organic solvent (butyl cellosolve, produced by Wako Pure Chemical Industries, Ltd.) was added.

Comparative Examples 1 and 2

Comparative Examples 1 and 2 were carried out similarly to Example 1, except the changes shown in "Table 2."
The composition shown in "Table 2" was as follows:
Alicyclic bis-A-type as epoxy resin: ST-3000, produced by Tohto Kasei Co., Ltd.
Biphenyl-type as epoxy resin: YX4000H, produced by Japan Epoxy Resins Co., Ltd.
Triepoxy resin triazine-type as epoxy resin: TEPIC-PAS, produced by Nissan Chemical Industries, Ltd.
The insulating sheets of Comparative Examples 1 and 2 were unfavorable at least in heat resistance, thermal conductivity or initial dielectric strength.

2. Circuit Board

A circuit board was prepared by using the insulating sheet of Example 1.
An insulating sheet and a metal layer were laminated on a metal substrate in that order; an electronic circuit is formed on the metal layer; and electronic parts were mounted on the electronic circuit. The circuit board obtained was a substrate superior in heat resistance, thermal conductivity and initial dielectric strength.

REFERENCE SIGNS LIST

1: Top roll, 2: Bottom roll, 3: Resin composition, 4: Bottom-sided supporting film, 5: Top-sided supporting film, and 6: Insulating sheet

The invention claimed is:

1. A sheet-shaped insulating sheet of a resin composition containing an epoxy resin, a curing agent and an inorganic filler, wherein one or both of the epoxy resin and the curing agent have a naphthalene structure, wherein the inorganic filler contains hexagonal boron nitride, and the hexagonal boron nitride is contained in an amount of 80 to 85 vol % in the entire resin composition, and the hexagonal boron nitride contains coarse particles having an average particle diameter of 10 to 400 μm and fine particles having an average particle diameter of 0.5 to 4.0 μm, wherein the blending rate of the coarse particles is 85% or more.

2. The insulating sheet according to claim 1, which is in the B stage state.

3. The insulating sheet according to claim 1, which is in the C stage state.

4. The insulating sheet according to claim 1, wherein the hexagonal boron nitride is oriented in a plane flow direction or a thickness direction of the sheet.

5. An insulating sheet, which is obtained by laminating multiple pieces of an insulating sheet according to claim 2, and cutting the laminate in a thickness direction.

6. A circuit board, comprising a metal substrate, an insulating sheet according to claim 1 laminated on the metal substrate, and an electronic circuit formed on the insulating sheet.

7. The circuit board according to claim 6, having electronic parts mounted on the electronic circuit.

8. The sheet-shaped insulating sheet defined in claim 1, produced by a method comprising a laminating step of laminating a resin composition containing an epoxy resin, a curing agent and an inorganic filler, wherein one or both of the epoxy resin and the curing agent have a naphthalene structure, the inorganic filler contains hexagonal boron nitride, and the inorganic filler is contained in an amount of 80 to 85 vol % in the entire resin composition, between two supporting films and a molding step of molding the laminate after the laminating step into an insulating sheet having a thickness of 50 to 500 μm.

9. The sheet-shaped insulating sheet defined in claim 8, wherein molding means in the molding step is a roll press and a temperature of the resin composition during molding is 5 to 300° C.

10. The sheet-shaped insulating sheet defined in claim 8, wherein the supporting film is a polymer film release-treated on a surface in contact with the resin composition.

11. The sheet-shaped insulating sheet defined in claim 8, wherein the supporting film is a metal foil.

12. The sheet-shaped insulating sheet defined in claim 2, produced by a laminating step of laminating multiple pieces of the insulating sheet, a cutting step of cutting the laminate after the laminating step in a thickness direction, and a planarization step of making the terminal cut face planar.

13. A method of producing the insulating sheet defined in claim 1, comprising a laminating step of laminating a resin composition containing an epoxy resin, a curing agent and an inorganic filler, wherein one or both of the epoxy resin and the curing agent have a naphthalene structure, the inorganic filler contains hexagonal boron nitride, and the inorganic filler is contained in an amount of 80 to 85 vol % in the entire resin composition, between two supporting films and a molding step of molding the laminate after the laminating step into an insulating sheet having a thickness of 50 to 500 μm.

14. The method of producing the insulating sheet according to claim 13, wherein molding means in the molding step is a roll press and a temperature of the resin composition during molding is 5 to 300° C.

15. The method of producing the insulating sheet according to claim 13, wherein the supporting film is a polymer film release-treated on a surface in contact with the resin composition.

16. The method of producing the insulating sheet according to claim 13, wherein the supporting film is a metal foil.

17. A method of producing the insulating sheet defined in claim 2, comprising a laminating step of laminating multiple pieces of an insulating sheet according to claim 2, a cutting step of cutting the laminate after the laminating step in a thickness direction, and a planarization step of making the terminal cut face planar.

18. A sheet-shaped insulating sheet of a resin composition containing an epoxy resin, a curing agent and an inorganic filler, wherein both of the epoxy resin and the curing agent have a naphthalene structure, wherein the inorganic filler contains hexagonal boron nitride, and the hexagonal boron nitride is contained in an amount of 80 to 85 vol % in the entire resin composition, and the hexagonal boron nitride contains coarse particles having an average particle diameter of 10 to 400 μm and fine particles having an average particle diameter of 0.5 to 4.0 μm, wherein the blending rate of the coarse particles is 85% or more.

* * * * *